United States Patent
Kim et al.

(10) Patent No.: US 11,860,045 B2
(45) Date of Patent: Jan. 2, 2024

(54) SEMICONDUCTOR DEVICE INCLUDING TEMPERATURE SENSING CIRCUIT

(71) Applicant: SK hynix Inc., Gyeonggi-do (KR)

(72) Inventors: Dahoo Kim, Gyeonggi-do (KR); Jongchern Lee, Gyeonggi-do (KR)

(73) Assignee: SK HYNIX INC., Gyeonggi-do (KR)

( * ) Notice: Subject to any disclaimer, the term of this patent is extended or adjusted under 35 U.S.C. 154(b) by 329 days.

(21) Appl. No.: 16/921,462

(22) Filed: Jul. 6, 2020

(65) Prior Publication Data

US 2021/0156746 A1 May 27, 2021

(30) Foreign Application Priority Data

Nov. 21, 2019 (KR) .................. 10-2019-0150219

(51) Int. Cl.
| | | |
|---|---|---|
| G01K 7/02 | (2021.01) | |
| G01J 5/00 | (2022.01) | |
| G01K 3/00 | (2006.01) | |
| G01R 27/00 | (2006.01) | |
| G01R 31/26 | (2020.01) | |
| G01R 31/28 | (2006.01) | |
| G01R 31/00 | (2006.01) | |

(52) U.S. Cl.
CPC ............ G01K 7/021 (2013.01); G01J 5/0007 (2013.01); G01K 3/005 (2013.01); G01R 27/00 (2013.01); G01R 31/26 (2013.01); G01R 31/2607 (2013.01); G01R 31/2851 (2013.01); G01R 31/2874 (2013.01); *G01R 31/00* (2013.01)

(58) Field of Classification Search
CPC ....... G01K 7/021; G01K 3/005; G01J 5/0007; G01R 27/00; G01R 31/26; G01R 31/2607; G01R 31/2851; G01R 31/2874; G01R 31/00
See application file for complete search history.

(56) References Cited

U.S. PATENT DOCUMENTS

| | | | | |
|---|---|---|---|---|
| 5,060,084 A | * | 10/1991 | Kawahara .......... | H04N 1/02463 358/472 |
| 6,281,760 B1 | * | 8/2001 | Koelling ........... | G11C 11/40626 331/66 |
| 8,277,120 B2 | * | 10/2012 | Ishii ................. | H03K 19/00369 374/170 |
| 2010/0061160 A1 | * | 3/2010 | Jeong ................ | G11C 7/04 374/163 |

(Continued)

FOREIGN PATENT DOCUMENTS

| | | | | |
|---|---|---|---|---|
| JP | WO2010073523 | * | 6/2012 | ......... G11C 11/401 |
| KR | 20040013885 | * | 2/2004 | ............... G01K 3/00 |

(Continued)

*Primary Examiner* — Alexander Satanovsky
*Assistant Examiner* — Sharah Zaab
(74) *Attorney, Agent, or Firm* — IP & T GROUP LLP

(57) ABSTRACT

A semiconductor device includes a control signal generation circuit configured to shift a test mode signal in response to a clock signal to generate a plurality of control signals, and a plurality of temperature sensing circuits each including a first resistor having a resistance that varies depending on temperature and configured to generate a temperature sensing signal based on the resistance in response to a corresponding control signal of the plurality of control signals.

20 Claims, 5 Drawing Sheets

(56) References Cited

U.S. PATENT DOCUMENTS

2011/0234743 A1* 9/2011 Nagumo .......... G03G 15/04054
347/247
2015/0280702 A1* 10/2015 Walker ................... H03K 3/012
327/543
2017/0344179 A1* 11/2017 Kim ..................... G09G 3/3677

FOREIGN PATENT DOCUMENTS

| KR | 20060131556 | * 12/2006 | ............. G01K 1/026 |
| KR | 10-0685000 | 2/2007 | |
| KR | 20170090552 | * 8/2017 | ............. G01R 31/02 |

* cited by examiner

SEMICONDUCTOR DEVICE INCLUDING TEMPERATURE SENSING CIRCUIT

CROSS-REFERENCE TO RELATED APPLICATION

This application claims priority under 35 U.S.C. § 119 to Korean Patent Application No. 10-2019-0150219, filed on Nov. 21, 2019, which is incorporated herein by reference in its entirety.

BACKGROUND

1. Field

Various embodiments relate to a semiconductor device having a temperature sensing circuit, and more particularly, to a semiconductor device capable of effectively sensing the temperature of a plurality of regions by using a temperature sensing circuit having a simple structure, and an operation method thereof.

2. Discussion of the Related Art

Various semiconductor devices implemented with integrated chips, such as CPUs, memories, and gate arrays, are incorporated and used in various consumer or industrial electronic devices such as computers, cellular phones, portable digital assistants (PDAs), digital cameras, game machines, servers, and workstations. A semiconductor memory may be a volatile memory device such as a static RAM (SRAM) or a dynamic RAM (DRAM), or a nonvolatile memory device such as a read only memory (ROM), a mask ROM (MROM), a programmable ROM (PROM), an erasable programmable ROM (EPROM), an electrically erasable and programmable ROM (EEPROM), a ferroelectric RAM (FRAM), a phase-change RAM (PRAM), a magnetoresistive RAM (MRAM), a resistive RAM (RRAM), or a flash memory.

When a DRAM, which is a volatile memory device, is powered off, data stored in a memory cell is lost. In order to continuously preserve data stored in its memory cells, a DRAM periodically performs a refresh operation, resulting in power consumption. In such a case, since data retention time of a DRAM memory cell varies with temperature, it is required to accurately measure a change in the temperature of the DRAM in order to reduce the power consumption of the DRAM by performing the refresh operation at an appropriate cycle.

Particularly, in the case of a graphics DRAM requiring fine DRAM processing and high speed operation, such as a graphics double data rate 6 (GDDR6), a change in temperature may have a significant influence on the characteristics and performance of the DRAM. Therefore, it is necessary to monitor the temperature of each region of the DRAM in a test stage and to analyze changes in temperature and temperature-performance relationships between the different regions of the DRAM when the DRAM is operating.

In the related art, a temperature information output device, for example, an on-die thermal sensor (ODTS) is disposed in a specific region of a memory device to measure internal temperature. However, since the temperature information output device occupies a relatively large area, it is not easy to apply the temperature information output device within a limited region of the memory device. In addition, in order to analyze temperature distribution inside the memory device in detail, it is required to measure the temperature of a plurality of sub-regions. In this context, embodiments of the invention arise.

SUMMARY

Various embodiments are directed to providing a semiconductor device capable of minimizing the structure of a temperature sensing circuit, measuring the temperature of a plurality of regions of the semiconductor device, and analyzing the temperature of each subdivided region, and an operation method thereof.

In an embodiment, a semiconductor device may include: a control signal generation circuit configured to shift a test mode signal in response to a clock signal to generate a plurality of control signals; and a plurality of temperature sensing circuits each including a first resistor having a resistance that varies depending on temperature and configured to generate a temperature sensing signal based on the resistance in response to a corresponding control signal of the plurality of control signals.

In an embodiment, a semiconductor device may include: a control signal generation circuit configured to sequentially generate a plurality of control signals in a test mode; and a plurality of temperature sensing circuits each configured to generate temperature sensing signals based on first and second resistors, which have different resistances from each other for temperature, in response to a corresponding control signal of the plurality of control signals, wherein each of the plurality of temperature sensing circuits comprises: a temperature sensing unit configured to sequentially generate first and second temperature sensing signals based on the first and second resistors in response to a selection signal; and an output unit configured to output the first and second temperature sensing signals in response to the corresponding control signal of the plurality of control signals.

In an embodiment, an operation method of a semiconductor device may include: shifting a test mode signal in response to a clock signal to sequentially generate a plurality of control signals; sequentially activates and deactivates a selection signal whenever generating the plurality of control signals; generating, in response to the selection signal, first and second temperature sensing signals based on a first resistor having a resistance that varies depending on temperature and a second resistor having a constant resistance, respectively; and measuring temperature by comparing the first and second temperature sensing signals.

In an embodiment, a semiconductor device may include: a control circuit configured to sequentially generate a plurality of control signals; and a plurality of sensing circuits each operative in response to a corresponding one of the plurality of control signals and each configured to alternately generate first and second temperature sensing signals based on temperature-independent and temperature-dependent resistors, respectively, thereby enabling determination of temperature of the corresponding sensing circuit.

In accordance with the present technology, the structure of the temperature sensing circuit can be minimized in a range applicable to a limited region of the semiconductor device. That is, the temperature sensing circuit is configured using a resistor having a resistance value varying depending on temperature and disposed in a plurality of regions of the semiconductor device, so that it is possible to measure the temperature of each region. Consequently, it is possible to analyze malfunction and performance characteristics due to temperature in detail based on the temperature measured for each subdivided region of the semiconductor device.

DETAILED DESCRIPTION

Figure 1:
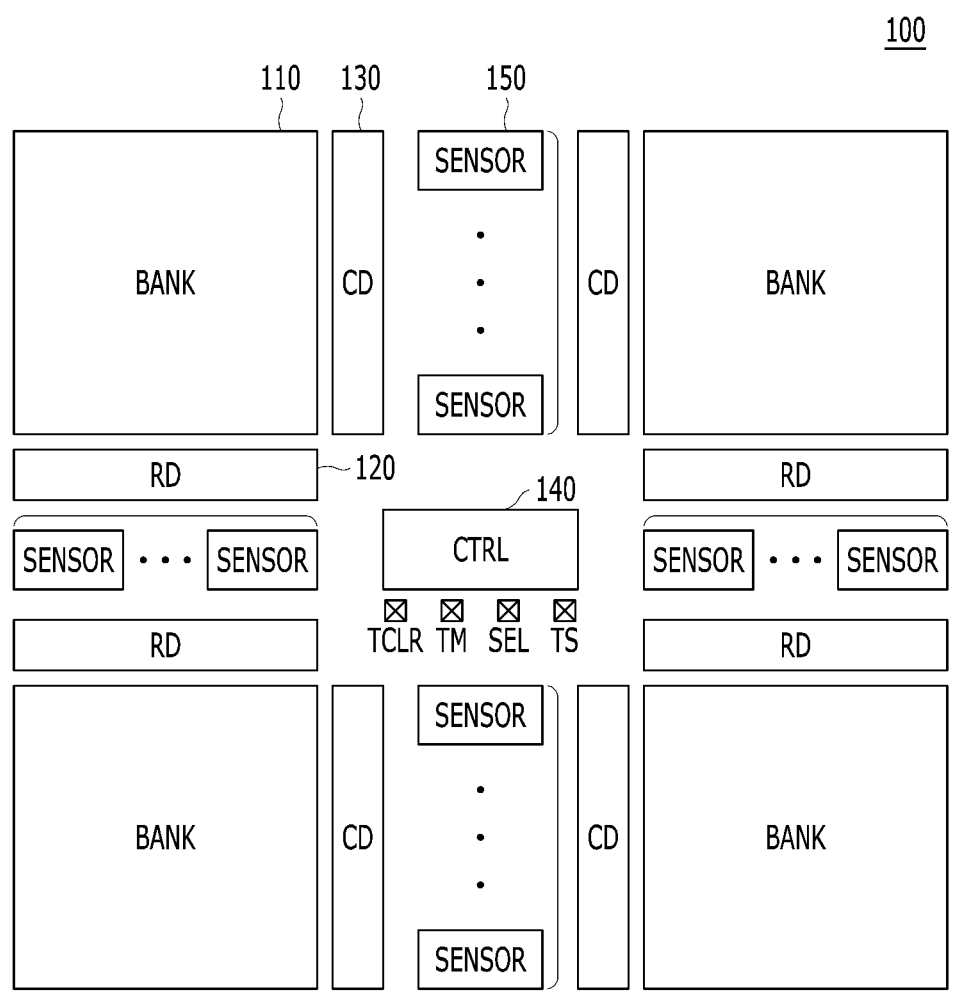
FIG. 1 is a diagram illustrating a semiconductor device in accordance with an embodiment.

Various embodiments are described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. Also, throughout the specification, reference to "an embodiment" or the like is not necessarily to only one embodiment, and different references to any such phrase are not necessarily to the same embodiment(s).

Throughout the specification, when one element is referred to as being 'connected to' or 'coupled to' another element, it may indicate that the former element is directly connected or coupled to the latter element or electrically connected or coupled to the latter element with one or more other elements interposed therebetween. Furthermore, when it is stated that an element "includes" or "comprises" a component, such statement is used in the open-ended sense and thus indicates that the element may further include or comprise one or more other components, unless stated otherwise. Similarly, any component presented in the singular form does not necessarily mean that there is only one such component; rather, there may be more than one such component.

FIG. 1 is a diagram illustrating a semiconductor device in accordance with an embodiment.

FIG. 1 illustrates an example in which a memory device 100 includes a plurality of memory cells, that is, a DRAM. However, the present invention is not limited thereto.

The memory device 100 may include memory banks (each denoted as BANK) 110 including a plurality of memory cells, and a row decoder (RD) 120 and a column decoder (CD) 130 corresponding to the memory banks 110, respectively. FIG. 1 illustrates an example in which the memory device 100 includes four memory banks 110 and components corresponding to the memory banks 110;

however, the present invention is not limited to that arrangement;

any suitable configuration of memory banks and associated components may be used. For convenience of description, only one representative component of multiple components having the same name and function in FIG. 1 is identified by a reference numeral.

Although not illustrated in detail in FIG. 1, the memory device 100 may be operationally subdivided into a memory region, a peripheral circuit region, and a pad region. The memory region of the memory device 100 may include memory cells for storing data, that is, the memory banks 110. In some cases, the memory device 100 may be subdivided differently, but the row decoder 120 and the column decoder 130 may be included in the memory region or equivalent thereof.

The peripheral circuit region of the memory device 100 may include various circuits for an operation of the memory device 100, for example, an input/output buffer, a DLL circuit, a power generator and the like. In accordance with an embodiment, the memory device 100 may include a control signal generation circuit (CTRL) 140 and a plurality of temperature sensing circuits (each denoted as SENSOR) 150 within the peripheral circuit region.

In a test mode, the control signal generation circuit 140 may sequentially generate a plurality of control signals. In response to the plurality of control signals generated by the control signal generation circuit 140, the plurality of temperature sensing circuits 150 may sequentially generate temperature sensing signals, respectively. The control signal generation circuit 140 and the plurality of temperature sensing circuits 150 are described in more detail with reference to FIG. 2 and FIG. 3, respectively.

The memory device 100 may include a plurality of input/output pads in the pad region. In the test mode, the memory device 100 may input/output test signals TCLK, TM, SEL, and TS through the plurality of input/output pads. Among the test signals, the test clock signal TCLK, the test mode signal TM, and the selection signal SEL may be inputted to the memory device 100 from external test equipment in the test mode. The memory device 100 may perform a test operation according to the test clock signal TCLK, the test mode signal TM, and the selection signal SEL, and output the temperature sensing signal TS to the test equipment.

Figure 2:
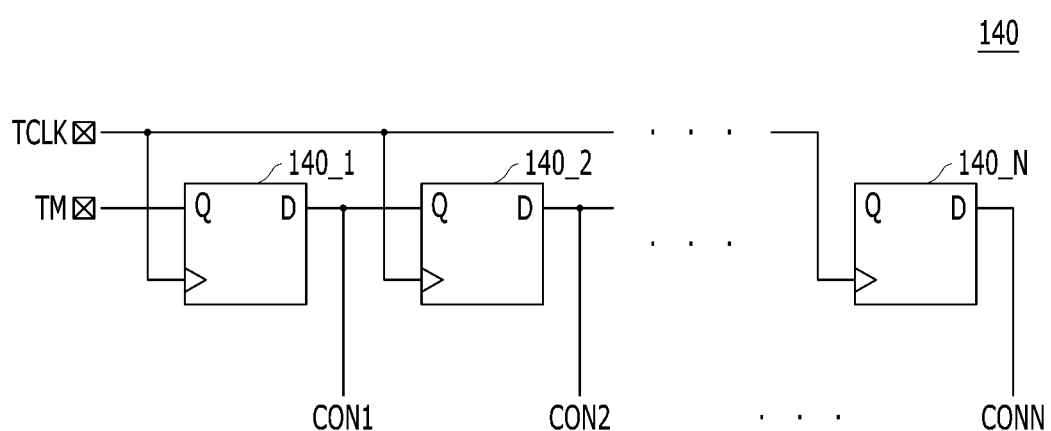
FIG. 2 is a diagram illustrating a control signal generation circuit of FIG. 1 in accordance with an embodiment.

FIG. 2 is a diagram illustrating the control signal generation circuit 140 of FIG. 1 in accordance with an embodiment.

Referring to FIG. 2, the control signal generation circuit 140 may include a plurality of D flip-flops 140_1 to 140_N connected in series to correspond to the plurality of temperature sensing circuits 150, respectively. Each of the plurality of D flip-flops 140_1 to 140_N may transfer an output signal of a preceding stage as an input signal of a next stage in response to the test clock signal TCLK.

The test mode signal TM may be activated in the test mode. When the test mode signal TM is activated, the first D flip-flop 140_1 may shift the test mode signal TM in response to the first toggling of the test clock signal TCLK and activate an output signal, that is, a first control signal CON1. When the output signal of the first D flip-flop 140_1 is activated, the second D flip-flop 140_2 may shift the output signal of the first D flip-flop 140_1 in response to the second toggling of the test clock signal TCLK and activate an output signal, that is, a second control signal CON2. In such a manner, the $N^{th}$ flip-flop 140_N may shift an output signal of a preceding stage in response to the $N^{th}$ toggling of the test clock signal TCLK and activate an $N^{th}$ control signal CONN.

The control signal generation circuit 140 may shift the test mode signal TM in response to the test clock signal TCLK and generate the plurality of control signals CON1 to CONN. That is, in the test mode, the control signal generation circuit 140 may sequentially generate the plurality of control signals CON1 to CONN whenever the test clock signal TCLK is toggled.

Figure 3:
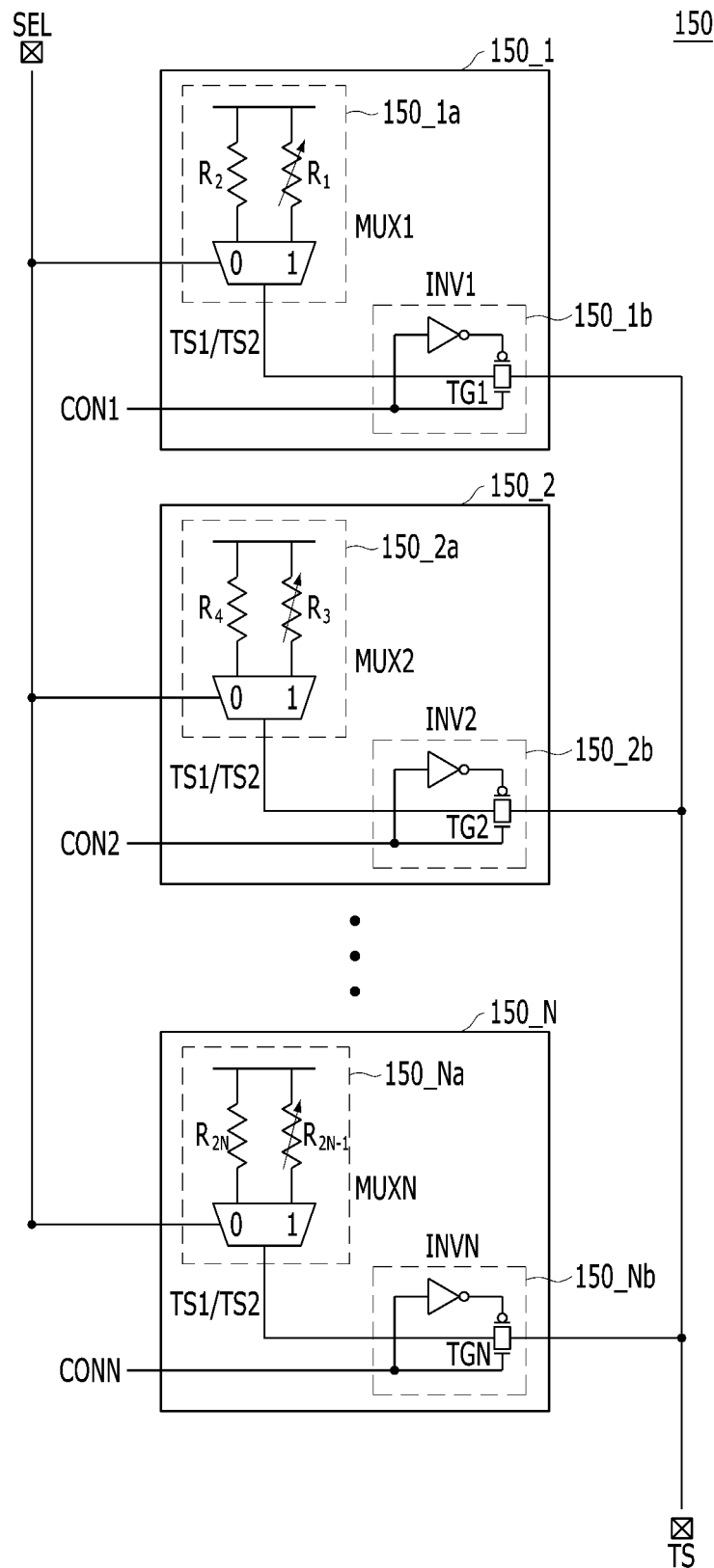
FIG. 3 is a diagram illustrating a plurality of temperature sensing circuits, such as those of FIG. 1, in accordance with an embodiment.

FIG. 3 is a diagram illustrating the plurality of temperature sensing circuits of FIG. 1 in accordance with an embodiment.

FIG. 3 illustrates an example in which the memory device 100 includes N temperature sensing circuits 150_1 to 150_N. The N temperature sensing circuits 150_1 to 150_N may correspond to the N D flip-flops 140_1 to 140_N, respectively.

Each of the first to $N^{th}$ temperature sensing circuits 150_1 to 150_N may have substantially the same configuration. Accordingly, the configuration of the first temperature sensing circuit 150_1 is described as an example. The first temperature sensing circuit 150_1 may include a temperature sensing unit 150_1a and an output unit 150_1b.

The temperature sensing unit 150_1a may include a first resistor R1, a second resistor R2, and a selector MUX1. The first resistor R1 may include a thermistor having a resistance that varies depending on temperature. On the other hand, the second resistor R2 may have a constant resistance regardless of a change in temperature. The second resistor R2 may be connected in parallel with the first resistor R1. In accordance with an embodiment, the first resistor R1 may include a negative temperature coefficient (NTC) thermistor having NTC characteristics in which resistance decreases as temperature increases.

The selector MUX1 may include a multiplexer. The selector MUX1 may select one of the first resistor R1 and the second resistor R2 in response to the selection signal SEL. For example, when the selection signal SEL has a logic high level, the selector MUX1 may select the first resistor R1. When the selection signal SEL has a logic low level, the selector MUX1 may select the second resistor R2.

Accordingly, when the selection signal SEL is sequentially generated at logic high and logic low levels, the selector MUX1 may sequentially select the first resistor R1 and the second resistor R2. The temperature sensing unit 150_1a may sequentially generate a first temperature sensing signal TS1 based on the first resistor R1 and a second temperature sensing signal TS2 based on the second resistor R2.

The output unit 150_1b may connect the temperature sensing unit 150_1a to an output terminal in response to the first control signal CON1. That is, when the first control signal CON1 is activated, the output unit 150_1b may output the first temperature sensing signal TS1 and the second temperature sensing signal TS2 and transfer them to the input/output pad that outputs the temperature sensing signal TS. The output unit 150_1b may include an inverter INV1 and a transmission gate TG1.

When a corresponding control signal (of the plurality of control signals CON1 to CONN) is activated, the corresponding temperature sensing circuit (of the first to $N^{th}$ temperature sensing circuits 150_1 to 150_N) may generate temperature sensing signals based on resistors having different resistances depending on temperature. The plurality of control signals CON1 to CONN may be sequentially generated in response to their respective temperature sensing circuits. Furthermore, whenever the plurality of control signals CON1 to CONN are generated, the selection signal SEL may be sequentially generated at logic high and logic low levels for each of the temperature sensing circuits.

Accordingly, when the first control signal CON1 is first activated, the temperature sensing unit 150_1a may be connected to the input/output pad of the temperature sensing signal TS by the output unit 150_1b. Subsequently, when the selection signal SEL is sequentially generated at logic high and logic low levels, the temperature sensing unit 150_1a may sequentially generate the first temperature sensing signal TS1 and the second temperature sensing signal TS2 based on the resistances of the first resistor R1 and the second resistor R2, respectively. Accordingly, the first temperature sensing circuit 150_1 may sequentially output the first temperature sensing signal TS1 and the second temperature sensing signal TS2 to the input/output pad of the temperature sensing signal TS.

When the second control signal CON2 is activated after the first control signal CON1, the second temperature sensing circuit 150_2 may sequentially output the first and second temperature sensing signals to the input/output pad of the temperature sensing signal TS in the same manner. Since the first to $N^{th}$ temperature sensing circuits 150_1 to 150_N sequentially generate the first and second temperature sensing signals, when the $N^{th}$ control signal CONN is finally activated, the $N^{th}$ temperature sensing circuit 150_N may sequentially output the first and second temperature sensing signals to the input/output pad of the temperature sensing signal TS.

Figure 4A:
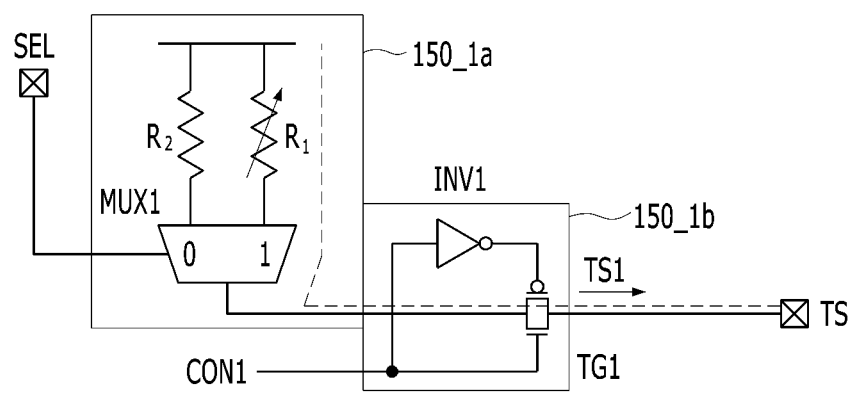
FIG. 4A and FIG. 4B are diagrams for explaining an operation of the temperature sensing circuit, such as that of FIG. 3, in accordance with an embodiment.
Figure 4B:
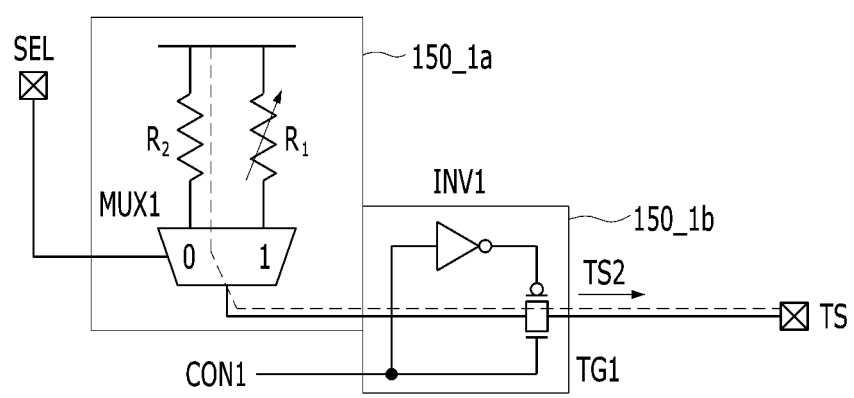

FIG. 4A and FIG. 4B are diagrams for explaining the operation of the temperature sensing circuit of FIG. 3 in accordance with an embodiment. FIG. 4A and FIG. 4B illustrate an example of the first temperature sensing circuit 150_1. Each of the other temperature sensing circuits 150_2 to 150_N may be configured in the same way.

Referring to FIG. 4A, when the first control signal CON1 is activated and the selection signal SEL has a logic high level, a first path may be formed from the first resistor R1 to the input/output pad of the temperature sensing signal TS. The first temperature sensing circuit 150_1 may output the first temperature sensing signal TS1 through the first path.

The voltage and the current of the first path may be measured using test equipment based on the first temperature sensing signal TS1 outputted through the input/output pad. Based on the measured voltage and current, the resistance of the first path may also be confirmed.

Referring to FIG. 4A, when the first control signal CON1 is activated and the selection signal SEL has a logic low level, a second path may be formed from the second resistor R2 to the input/output pad of the temperature sensing signal TS. The first temperature sensing circuit 150_1 may output the second temperature sensing signal TS2 through the second path.

Similarly, the voltage and the current of the second path may be measured using the test equipment based on the second temperature sensing signal TS2 outputted through the input/output pad. Based on the measured voltage and current, the resistance of the second path may also be confirmed.

Based on the confirmed resistances of the first and second paths, the resistance of the first resistor R1 may be confirmed. The first resistor R1 may have a relatively large resistance. On the other hand, the second resistor R2 may include wire resistance corresponding to the length of the first resistor R1. Accordingly, the resistance of the first resistor R1 may be confirmed by a difference between the resistances of the first path and the second path.

As described above, the first resistor R1 may include a thermistor. The thermistor may include a resistor body and a resistor contact part to be laid out in the circuit. Both the resistor body and the resistor contact part of the thermistor may have resistances proportional or inversely proportional to temperature. That is, the resistance of the thermistor may be represented by an equation including a temperature variable. Accordingly, the temperature of the first resistor R1 may be confirmed using the confirmed resistance of the first resistor R1.

In accordance with an embodiment, the test mode signal TM may be activated in the test mode. The control signal generation circuit 140 may shift the test mode signal TM in response to the test clock signal TCLK and sequentially generate the plurality of control signals CON1 to CONN. Although FIG. 1 illustrates that the memory device 100 receives the selection signal SEL through the input/output pad, the control signal generation circuit 140 may generate the selection signal SEL based on the test clock signal TCLK. Whenever generating the plurality of control signals CON1 to CONN in response to the test clock signal TCLK, the control signal generation circuit 140 may sequentially generate the selection signal SEL at logic high and logic low levels.

In response to the selection signal SEL, the first temperature sensing circuit 150_1 may generate the first and second temperature sensing signals TS1 and TS2, respectively, based on the first resistor R1 having a resistance that varies depending on temperature and the second resistor R2 having a constant resistance regardless of temperature. The first temperature sensing circuit 150_1 may transmit the first and second temperature sensing signals TS1 and TS2 to the input/output pad in response to the first control signal CON1. The temperature of the first temperature sensing circuit 150_1 may be measured by comparing the first and second temperature sensing signals TS1 and TS2 outputted to the input/output pad.

As the plurality of control signals CON1 to CONN are sequentially generated, the plurality of temperature sensing circuits 150_1 to 150_N may sequentially transmit a plurality of first and second temperature sensing signals to the input/output pad. Consequently, the temperature of the plurality of temperature sensing circuits 150_1 to 150_N may be sequentially measured by comparing the plurality of first and second temperature sensing signals outputted to the input/output pad.

The use of the term "unit" in identifying or describing any element herein is not intended to invoke means-plus-function interpretation. Each such element may be configured with the appropriate circuit elements, as described herein, or equivalents thereof consistent with the teachings herein.

Although various embodiments have been illustrated and described, it will be apparent to those skilled in the art in light of the present disclosure that various changes and modifications may be made without departing from the spirit and scope of the invention as defined in the following claims.

What is claimed is:

1. A semiconductor device comprising:
a control signal generation circuit having a plurality of signal shifting stages connected in series, the control signal generation circuit configured a) to sequentially shift a single test mode signal in response to a toggling of a clock signal, and b) to sequentially generate a plurality of control signals for controlling a plurality of temperature sensing circuits, using at least one sequentially shifted test mode signal obtained from a preceding stage of the plurality of signal shifting stages; and
the plurality of temperature sensing circuits each including a first resistor having a resistance that varies depending on temperature and configured to receive the plurality of control signals and generate a temperature sensing signal based on the resistance in response to a corresponding control signal of the plurality of control signals.

2. The semiconductor device of claim 1, wherein each of the plurality of temperature sensing circuits further comprises:
a second resistor connected in parallel with the first resistor and having a constant resistance;
a selector configured to select one of the first resistor and the second resistor in response to a selection signal inputted to the semiconductor device from an external source and having sequentially generated low and high logic levels; and
an output unit configured to connect the selected resistor to an output terminal in response to the corresponding control signal of the plurality of control signals.

3. The semiconductor device of claim 2, wherein the control signal generation circuit sequentially activates and deactivates the selection signal whenever shifting the test mode signal in response to the clock signal.

4. The semiconductor device of claim 2, wherein, when the corresponding control signal is activated, each of the plurality of temperature sensing circuits sequentially generates a first temperature sensing signal and a second temperature sensing signal in response to the selection signal.

5. The semiconductor device of claim 4, wherein the first temperature sensing signal has a current amount corresponding to the resistance of the first resistor and the second temperature sensing signal has a current amount corresponding to the resistance of the second resistor.

6. The semiconductor device of claim 1, wherein the first resistor includes a negative temperature coefficient (NTC) thermistor in which the resistance decreases as temperature increases.

7. The semiconductor device of claim 1, wherein the control signal generation circuit comprises a plurality of D flip-flops corresponding to the plurality of temperature sensing circuits, respectively, and connected in series with one another.

8. The semiconductor device of claim 7, wherein each of the D flip-flops transfers, in response to the clock signal, an output signal which forms an input signal to the D flip-flop next in series to sequentially generate the plurality of control signals.

9. A semiconductor device comprising:
a control signal generation circuit having a plurality of signal shifting stages connected in series, the control signal generation circuit configured a) to sequentially shift a single test mode signal in response to a toggling of a clock signal, and b) to sequentially generate a plurality of control signals for controlling a plurality of temperature sensing circuits, using at least one sequentially shifted test mode signal in a test mode obtained from a preceding stage of the plurality of signal shifting stages; and
the plurality of temperature sensing circuits each configured to generate temperature sensing signals based on first and second resistors, which have different resistances from each other for temperature, in response to a corresponding control signal of the plurality of control signals,
wherein each of the plurality of temperature sensing circuits comprises:
a temperature sensing unit configured to sequentially generate first and second temperature sensing signals based on the first and second resistors in response to a selection signal; and an output unit configured to output the first and second temperature sensing signals in response to the corresponding control signal of the plurality of control signals.

10. The semiconductor device of claim 9, wherein the temperature sensing unit comprises:
the first resistor having a resistance that varies depending on temperature;
the second resistor connected in parallel with the first resistor and having a constant resistance; and
a selector configured to select one of the first resistor and the second resistor in response to the selection signal inputted to the semiconductor device from an external source and having sequentially generated low and high logic levels.

11. The semiconductor device of claim 9, wherein the first resistor includes a negative temperature coefficient (NTC) thermistor in which the resistance decreases as temperature increases.

12. The semiconductor device of claim 9, wherein the control signal generation circuit comprises a plurality of D flip-flops configured to shift a test mode signal in response to a clock signal and generate the plurality of control signals, respectively.

13. The semiconductor device of claim 12, wherein the control signal generation circuit sequentially activates and deactivates the selection signal whenever shifting the test mode signal in response to the clock signal.

14. An operation method of a semiconductor device, the operation method comprising:
sequentially shifting, with a control generation circuit having a plurality of signal shifting stages connected in series, a single test mode signal in response to a toggling of a clock signal, and sequentially generating a plurality of control signals using at least one sequentially shifted test mode signal obtained from a preceding stage of the plurality of signal shifting stages;
sequentially activates and deactivates a selection signal whenever generating the plurality of control signals for controlling a plurality of temperature sensing circuits;
generating, in response to the selection signal, first and second temperature sensing signals based on a first resistor having a resistance that varies depending on temperature and a second resistor having a constant resistance, respectively; and
measuring temperature by comparing the first and second temperature sensing signals.

15. The operation method of claim 14, further comprising transmitting the first and second temperature sensing signals of a plurality of first and second temperature sensing signals to an input/output pad in response to a corresponding control signal of the plurality of control signals.

16. The operation method of claim 15, wherein the plurality of first and second temperature sensing signals are sequentially transmitted to the input/output pad in response to the plurality of control signals that are sequentially generated.

17. A semiconductor device comprising:
a control circuit having a plurality of signal shifting stages connected in series, the control circuit configured a) to sequentially shift a single test mode signal in response to a toggling of a clock signal, and b) to sequentially generate a plurality of control signals for controlling a plurality of sensing circuits, using at least one sequentially shifted test mode signal obtained from a preceding stage of the plurality of signal shifting stages; and
the plurality of sensing circuits each operative in response to a corresponding one of the plurality of control signals and each configured to alternately generate first and second temperature sensing signals based on temperature-independent and temperature-dependent resistors, respectively, thereby enabling determination of temperature of the corresponding sensing circuit.

18. The semiconductor device of claim 1, wherein the control signal generation circuit shifts the test mode signal in response to a first toggling of the clock signal and activates a first control signal and shifts a shifted test mode signal in response to a second toggling of the clock signal and actives a second control signal.

19. The semiconductor device of claim 9, wherein the control signal generation circuit shifts the test mode signal in response to a first toggling of the clock signal and activates a first control signal and shifts a shifted test mode signal in response to a second toggling of the clock signal and actives a second control signal.

20. The semiconductor device of claim 17, wherein the control signal generation circuit shifts the test mode signal in response to a first toggling of the clock signal and activates a first control signal, and shifts a shifted test mode signal in response to a second toggling of the clock signal and actives a second control signal.

* * * * *